(12) United States Patent
Katou et al.

(10) Patent No.: US 10,085,336 B2
(45) Date of Patent: Sep. 25, 2018

(54) MULTILAYER WIRING BOARD

(71) Applicant: HITACHI CHEMICAL COMPANY, LTD., Tokyo (JP)

(72) Inventors: Masahiro Katou, Chikusei (JP); Yasuyuki Koshikawa, Chikusei (JP); Hiroshi Wada, Chikusei (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/399,535

(22) PCT Filed: May 9, 2013

(86) PCT No.: PCT/JP2013/063033
§ 371 (c)(1),
(2) Date: Nov. 7, 2014

(87) PCT Pub. No.: WO2013/168761
PCT Pub. Date: Nov. 14, 2013

(65) Prior Publication Data
US 2015/0136447 A1    May 21, 2015

(30) Foreign Application Priority Data

May 10, 2012    (JP) ................................. 2012-108459

(51) Int. Cl.
*H05K 1/02*    (2006.01)
*H05K 3/46*    (2006.01)
(Continued)

(52) U.S. Cl.
CPC .......... *H05K 1/0218* (2013.01); *H05K 1/024* (2013.01); *H05K 1/0298* (2013.01);
(Continued)

(58) Field of Classification Search
CPC ............ H05K 1/02; H05K 1/03; H05K 1/032; H05K 3/38; H05K 3/108; H01L 23/48;
(Continued)

(56) References Cited

U.S. PATENT DOCUMENTS 5,021,370 A * 6/1991 Ishikawa et al. ............ 501/95.1
5,325,094 A * 6/1994 Broderick .......... H01Q 15/0026
342/1
(Continued)

FOREIGN PATENT DOCUMENTS

JP    06-005998    1/1994
JP    2007-234500    9/2007
(Continued)

OTHER PUBLICATIONS

International Search Report of Appln. No. PCT/JP2013/063033 dated Jul. 16, 2013 in English.
(Continued)

*Primary Examiner* — Xiaoliang Chen
(74) *Attorney, Agent, or Firm* — Fitch, Even, Tabin & Flannery, LLP

(57) ABSTRACT

A multilayer wiring board has a strip structure comprising a core material in which a ground pattern is disposed on one side of an insulating layer and a strip line is disposed on the other side, a prepreg disposed on the strip line of the core material, and a ground pattern disposed on the prepreg. In this multilayer wiring board, the core material is formed with a high frequency-adaptive base material, and the prepreg is formed with a general-purpose material.

13 Claims, 7 Drawing Sheets

(51) Int. Cl.
*H05K 1/03* (2006.01)
*H05K 1/11* (2006.01)
*H05K 3/42* (2006.01)

(52) U.S. Cl.
CPC ........... *H05K 1/0366* (2013.01); *H05K 1/115* (2013.01); *H05K 3/4626* (2013.01); *H05K 3/4688* (2013.01); *H05K 3/429* (2013.01); *H05K 3/4652* (2013.01); *H05K 2201/0154* (2013.01); *H05K 2201/0723* (2013.01)

(58) Field of Classification Search
CPC ......... H01L 23/66; H01L 23/185; H01Q 1/38; H01Q 1/52
USPC .... 174/251, 254–256, 258, 260, 266; 333/1, 333/133, 204, 247; 428/209, 220, 414, 428/462; 361/763, 771, 818; 257/173, 257/679
See application file for complete search history.

(56) References Cited

U.S. PATENT DOCUMENTS

| | | | | |
|---|---|---|---|---|
| 5,500,555 | A * | 3/1996 | Ley | H01L 23/367 257/700 |
| 5,700,607 | A * | 12/1997 | Rath | G03F 7/027 430/14 |
| 5,926,377 | A * | 7/1999 | Nakao et al. | 361/763 |
| 6,204,454 | B1 | 3/2001 | Gotoh et al. | 174/255 |
| 7,402,758 | B2 | 7/2008 | Mattix | |
| 7,741,834 | B2 | 6/2010 | Dang et al. | |
| 8,168,891 | B1 * | 5/2012 | Goergen | H01P 3/081 174/255 |
| 2002/0053469 | A1 * | 5/2002 | Matsuda | 174/266 |
| 2003/0132025 | A1 * | 7/2003 | Wakihara et al. | 174/256 |
| 2003/0179049 | A1 * | 9/2003 | Goergen | 333/1 |
| 2004/0000968 | A1 * | 1/2004 | White et al. | 333/185 |
| 2004/0085164 | A1 * | 5/2004 | Hirabayashi | 333/204 |
| 2004/0161612 | A1 * | 8/2004 | Takanezawa et al. | 428/414 |
| 2004/0259317 | A1 * | 12/2004 | Ding | H01L 21/4857 438/393 |
| 2005/0064159 | A1 * | 3/2005 | Amou et al. | 428/209 |
| 2005/0077083 | A1 * | 4/2005 | Mattix | H05K 1/115 174/265 |
| 2005/0087864 | A1 * | 4/2005 | Yang | H01L 23/3128 257/720 |
| 2005/0146403 | A1 * | 7/2005 | Okubora | H01L 23/49833 333/247 |
| 2005/0248418 | A1 * | 11/2005 | Govind et al. | 331/179 |
| 2006/0092079 | A1 * | 5/2006 | de Rochemont | 343/700 MS |
| 2007/0069834 | A1 * | 3/2007 | Ikuta et al. | 333/133 |
| 2007/0085108 | A1 * | 4/2007 | White et al. | 257/173 |
| 2007/0222052 | A1 * | 9/2007 | Kabumoto | 257/679 |
| 2007/0296534 | A1 * | 12/2007 | Carastro et al. | 336/200 |
| 2008/0049407 | A1 * | 2/2008 | Ohmi et al. | 361/771 |
| 2008/0049410 | A1 * | 2/2008 | Kawaguchi et al. | 361/818 |
| 2008/0191956 | A1 * | 8/2008 | Watanabe | 343/841 |
| 2009/0000812 | A1 * | 1/2009 | Kariya | 174/260 |
| 2009/0015278 | A1 * | 1/2009 | Dang | G01R 31/2884 324/762.06 |
| 2009/0039911 | A1 * | 2/2009 | Dang | G01R 31/2812 324/762.02 |
| 2009/0266591 | A1 * | 10/2009 | Amou et al. | 174/258 |
| 2010/0129676 | A1 * | 5/2010 | Fujimoto et al. | 428/462 |
| 2012/0132458 | A1 * | 5/2012 | Sekine | 174/254 |
| 2012/0168214 | A1 * | 7/2012 | Kashiwagi | H01L 23/3121 174/257 |
| 2012/0205142 | A1 * | 8/2012 | Higo et al. | 174/251 |
| 2012/0301718 | A1 * | 11/2012 | Nishiura et al. | 428/380 |
| 2013/0040153 | A1 * | 2/2013 | Fujimoto et al. | 428/462 |
| 2013/0168143 | A1 * | 7/2013 | Park | H05K 1/025 174/257 |

FOREIGN PATENT DOCUMENTS

| | | |
|---|---|---|
| JP | 2009-016521 | 1/2009 |
| TW | I239603 B | 9/2005 |
| WO | WO 2010/103721 | 9/2010 |

OTHER PUBLICATIONS

International Preliminary Report of Appln. No. PCT/JP2013/063033 dated Nov. 20, 2014 in English.
Office Action in counterpart TW Patent Application No. 102116722 dated Nov. 22, 2016.

* cited by examiner (a)

(b)

MULTILAYER WIRING BOARD

TECHNICAL FIELD

The present invention relates to a multilayer wiring board, and, more particularly, to a multilayer wiring board which can be applied to high frequencies.

BACKGROUND ART

Most of conventional multilayer wiring boards are used in operating frequencies lower than 1 GHz. However, in recent years, in accordance with increase of an amount of information processed in electronic equipment, improvement of information processing capacity by downsizing and integration of a system, and, further, increase in information processing speed (realizing higher operating frequencies) have proceeded. In accordance with such trend, downsizing, higher density wiring, increase in the number of layers and adaptation to high frequencies (a lower transmission loss) are desired for multilayer wiring boards used in electronic equipment.

Particularly, as to adaptation to higher frequencies, it is requested to realize a lower transmission loss at an operating frequency of 1 GHz or higher (particularly, approximately from 1 to 3 GHz). To respond to such a request, while a high frequency-adaptive base material is used as a material for an insulating layer of the multilayer wiring board, there is a problem such as increase in cost due to use of the high frequency-adaptive base material.

Therefore, Patent Literature 1 discloses a multilayer wiring board which adapts to high frequencies at a relatively low cost by using a core material of a high frequency-adaptive base material in an outermost layer and using a general-purpose base material in an inner layer.

CITATION LIST

Patent Literature

Patent Literature 1: Japanese Patent Application Laid-Open Publication No. Hei 6-005998

SUMMARY OF INVENTION

Technical Problem

However, compared to a general-purpose base material, not only is a high frequency-adaptive base material higher in cost, but tends to be inferior in electric corrosion characteristics. Therefore, as in Patent Literature 1, there is a possibility in the multilayer wiring board in which the high frequency-adaptive base material and the general-purpose base material are used that although it is possible to prevent increase in cost, electric corrosion characteristics may degrade. Further, as in Patent Literature 1, there is also a case where it is necessary to provide a high frequency signal line also in the inner layer in addition to a case where a high frequency signal line is provided only in the outermost layer.

An object of the present invention is to provide a multilayer wiring board which is relatively inexpensive and which has high flexibility of a layer structure while maintaining high frequency characteristics and electric corrosion characteristics.

Solution to Problem

A multilayer wiring board according to the present invention comprises a core material having an insulating layer, a first ground pattern disposed on one side of the insulating layer, and a strip line disposed on the other side of the insulating layer, a prepreg disposed on the strip line of the core material, and a second ground pattern disposed on the prepreg. In this multilayer wiring board, the insulating layer of the core material is configured to include a high frequency-adaptive base material, and the prepreg is configured to include a general-purpose base material.

A term of high frequency used here means a frequency of an operating frequency equal to or higher than 1 GHz, and, particularly, means, though not being limited to, a frequency of approximately from 1 to 3 GHz. Further, a term of low frequency means a frequency of an operating frequency lower than 1 GHz. It should be noted that the same is true in the following description.

In the above-described multilayer wiring board, a bottom face of the strip line may be located at a side of the insulating layer configured to include the high frequency-adaptive base material.

In the above-described multilayer wiring board, the strip line may have a protruding shape toward a side of the prepreg.

In the above-described multilayer wiring board, surface roughness of the bottom face of the strip line may be greater than surface roughness of a surface of the strip line.

In the above-described multilayer wiring board, an area where the bottom face of the strip line contacts the insulating layer may be equal to or larger than an area where the surface of the strip line contacts the prepreg.

In the above-described multilayer wiring board, a ratio of a thickness between the core material and the prepreg may be any ratio from 1:4 to 5:1. Further, in the above-described multilayer wiring board, a ratio between a line width and a thickness of the strip line may be any ratio from 1:1 to 15:1.

In the above-described multilayer wiring board, the high frequency-adaptive base material may be a base material having relative permittivity of less than 4.00 and a dielectric loss tangent of less than 0.0100. Further, in the above-described multilayer wiring board, the general-purpose base material may be a base material having relative permittivity after curing of 4.20 or greater and a dielectric loss tangent of 0.0130 or greater.

The above-described multilayer wiring board may further comprise a through-hole which penetrates through the core material, the prepreg and the second ground pattern.

Advantageous Effects of Invention

According to the present invention, it is possible to provide a multilayer wiring board which is relatively inexpensive while maintaining high frequency characteristics and electric corrosion characteristics.

DESCRIPTION OF EMBODIMENTS

Figure 1:
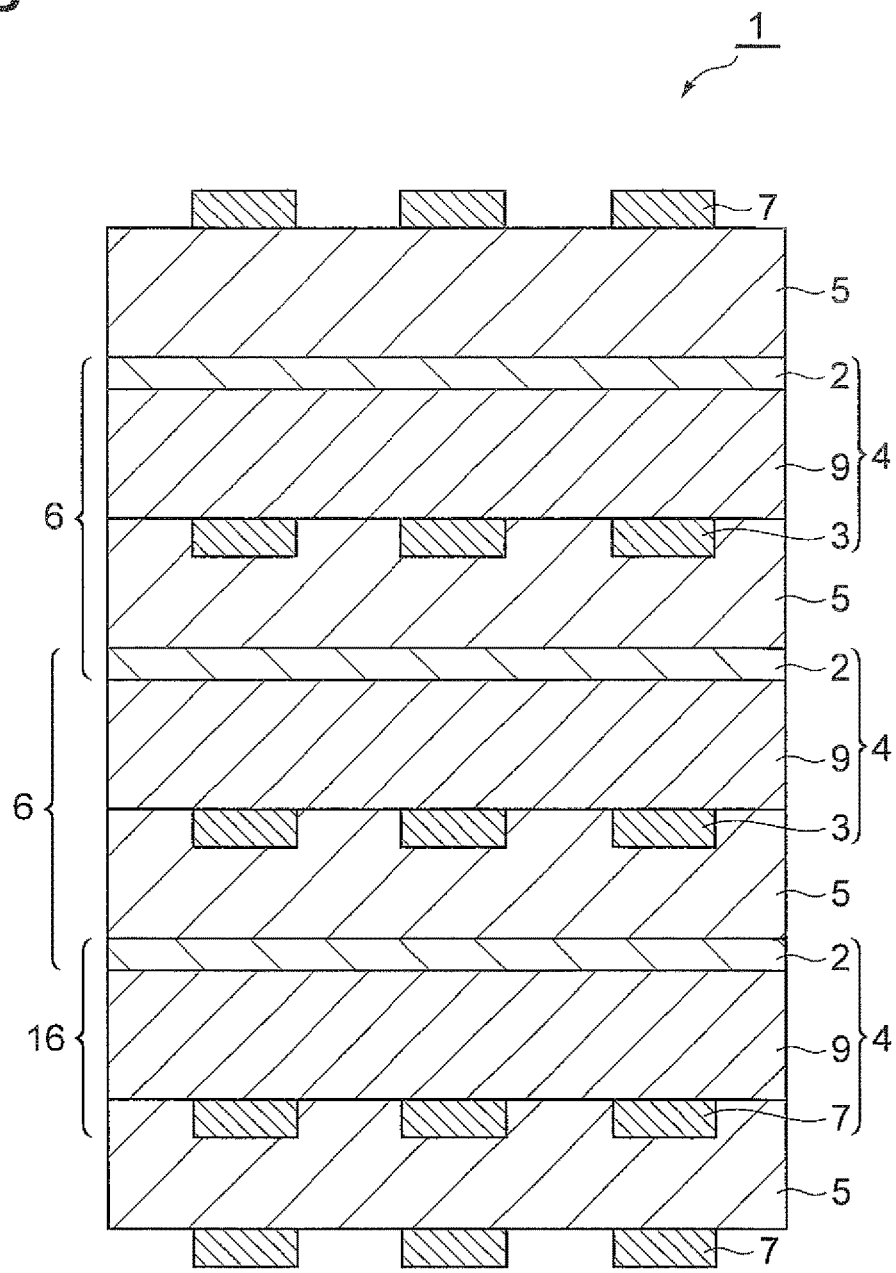
FIG. 1 is a schematic diagram of a cross section illustrating an example of an embodiment of a multilayer wiring board of the present invention.

An example of an embodiment of a multilayer wiring board of the present invention is illustrated in FIG. 1. The multilayer wiring board 1 of the present embodiment has a strip structure 6 comprising a core material 4 having an insulating layer 9, a ground pattern 2 disposed on one side of the insulating layer 9 and a strip line 3 disposed on the other side of the insulating layer 9, a prepreg 5 disposed on the strip line 3 of the core material 4, and another ground pattern 2 disposed on the prepreg 5. In the multilayer wiring board 1, the insulating layer 9 of the core material 4 is formed with a high frequency-adaptive base material, and the prepreg 5 is formed with a general-purpose base material.

While the multilayer wiring board of the present embodiment can be used in the overall field in which high frequency characteristics, low cost and electric corrosion characteristics are required, the multilayer wiring board is preferably used in, particularly, a PRB (Probe Card: a board with a probe for a semiconductor inspection tool) for a CIS (CMOS Image Sensor, CMOS: Complementary Metal-Oxide Semiconductor), a socket board for inspecting electronic parts, or the like, because higher effects can be exerted. In the present embodiment, the term of high frequency characteristics refer to characteristics in which a transmission loss is low at an operating frequency of 1 GHz or higher, and, particularly, though not being limited to, characteristics in which a transmission loss is low at an operating frequency of approximately from 1 GHz to 3 GHz. Therefore, improvement of the high frequency characteristics refers to reduction in a transmission loss at a high frequency.

The strip structure refers to a wiring structure in which the strip line is put between the ground patterns from both sides via the insulating layers. As illustrated in FIG. 1, in the strip structure 6 according to one embodiment of the present invention, the ground pattern 2 is disposed on one side of the two sides of the insulating layer 9, the strip line 3 is disposed on the other side of the two sides, and another ground pattern 2 is disposed on the strip line 3 via the prepreg 5. It should be noted that in the present embodiment, as illustrated in FIG. 1, a low frequency signal line 7 is disposed as a conductor pattern via the insulating layer 9 below the ground pattern 2 in the strip structure 6 located at the bottom so as to configure a micro-strip structure 16. It is also possible to dispose the strip line 3 or a high frequency signal line 3 in place of the low frequency signal line 7 as the conductor pattern of this micro-strip structure 16. Here, the micro-strip structure 16 refers to a wiring structure in which the ground pattern 2 is disposed on only one side of the strip line 3 via the insulating layer 9.

The core material refers to a material in which a ground pattern is formed on one side of the insulating layer and a strip line is formed on the other side by forming, as a starting material, a metallic foil-pasted laminated sheet obtained by pasting metallic foils on both sides of the insulating layer and patterning the metallic foils, plating, or the like. A high frequency-adaptive base material is used for the insulating layer of the metallic foil-pasted laminated sheet which forms the core material, and a matte surface bonded with the insulating layer with its surface roughness being reduced, or the like as the metallic foil. While a copper foil, an aluminum foil, a nickel foil, or the like used for manufacturing a typical multilayer wiring board can be used as the metallic foil, a copper foil is preferable in terms of ease of access and processing. Further, for the same reasons, a copper foil-pasted laminated sheet is preferable as the metallic foil-pasted laminated sheet.

The base material which refers to a material for forming the insulating layer, includes a material obtained by impregnating a reinforcement material with an insulating resin and curing the resin, or a material obtained by curing an insulating resin with no reinforcement material. Further, the high frequency-adaptive base material which refers to a base material with relative permittivity of less than 4.00 and a dielectric loss tangent of less than 0.0100, is preferably a base material with relative permittivity of from 3.30 to 3.90 and a dielectric loss tangent of from 0.0020 to 0.0070 in terms of ease of access, and is more preferably a base material with relative permittivity of from 3.30 to 3.50 and a dielectric loss tangent of from 0.0020 to 0.0030 in terms of improvement of high frequency characteristics. Here, values of the relative permittivity and the dielectric loss tangent are both values at 1 GHz measured using a tri-plate strip line resonator method (IPC-TM-650 2.5.5.5), and the same will apply hereafter. As the high frequency-adaptive base material, GFA-2, HE679G, FX-2, FX-3, LX-67Y, LZ-71G (all manufactured by Hitachi Chemical Company, Ltd., trade names), MEGTRON 4, MEGTRON 6 (all manufactured by Panasonic Corporation, trade names), N4000-13, N4000-13SI (all manufactured by PARK ELECTROCHEMICAL CORP., trade names), or the like, obtained by impregnating a glass fiber which is a reinforcement material with an insulating resin and semi-curing the resin, can be used. Further, as the metallic foil-pasted laminated sheet using this high frequency-adaptive base material and the metallic foil, MCL-FX-2, MCL-LX-67Y, MCL-LZ-71G (all manufactured by Hitachi Chemical Company, Ltd., trade names, registered trademark "MCL"), MEGTRON 4, MEGTRON 6 (all manufactured by Panasonic Corporation, trade names), N4000-13, N4000-13SI (all manufactured by PARK ELECTROCHEMICAL CORP., trade names) or the like, can be used. Patterning of the ground pattern and the strip line can be performed using a subtraction method or the like.

The prepreg refers to a sheet-like member obtained by impregnating a reinforcement material with an insulating resin and semi-curing the resin or an insulating layer formed by curing through integrally lamination, or the like, by application of heat and pressure using this semi-cured sheet-like member. The prepreg used in the present embodiment is formed using a general-purpose base material. The general-purpose base material refers to a base material with relative permittivity after curing of 4.20 or higher and a dielectric loss tangent of 0.0130 or higher. As the reinforcement material of the general-purpose base material, paper, or woven fabric using glass fiber, aramid fiber, or the like, or non-woven fabric can be used. Further, as the insulating resin, a thermosetting resin such as an epoxy resin, a polyimide resin or a phenolic resin can be used. Such a general-purpose base material includes, for example, an FR-4 material (Flame Retardant Type 4) or an FR-5 material (Flame Retardant Type 5) as an epoxy system, and a GPY material as a polyimide system. Further, an epoxy system general-purpose base material available in the market as a glass epoxy multilayer material (ANSI FR-4 grade) includes GEA-679, GEA-67, E-67, E-679, E-679F, BE-67G, E-75G (all manufactured by Hitachi Chemical Company, Ltd., trade names) or the like. Still further, a polyimide system general-purpose base material available in the market as a polyimide multilayer material (ANSI GPY grade) includes I-671 (manufactured by Hitachi Chemical Company, Ltd., trade name) or the like.

The ground pattern refers to a conductor pattern which realizes the strip line having an appropriate and stable value of characteristic impedance and which has an action of reducing noise. Typically, the ground patterns are formed in a solid pattern, and are disposed so as to put the strip line therebetween from the both sides of an upper side and a lower side via the insulating layers. In the present embodiment, as illustrated in FIG. 1, the ground patterns 2, 2 are disposed so as to put the strip line 3 therebetween from the both sides of the upper side and the lower side via the prepreg (insulating layer) 5 and the insulating layer 9 (or the base material 9).

The strip line refers to a conductor pattern for conveying a signal operating at a high frequency, and is also referred to as a high frequency signal line. Further, the strip line is disposed inside the insulating layer put between the ground patterns in the strip structure. In the present embodiment, as illustrated in FIG. 1, the strip line is disposed between the prepreg (insulating layer) 5 and the insulating layer 9 (or the base material 9) which are put between the ground patterns 2, that is, inside the insulating layer in the strip structure 6.

In the present embodiment, as described above, the core material is formed with a high frequency-adaptive base material, and the prepreg is formed with a general-purpose base material. Because the metallic foil configuring the core material is laminated so that the matte surface faces a side of the insulating layer of the core material, a bottom face, that is, the matte surface of the metallic foil of the strip line whose cross section formed by patterning the metallic foil or plating has a substantially square shape, is disposed at the side of the insulating layer of the core material. The matte surface refers to a surface on a side having larger irregularities than those on a shiny surface which is an opposite surface. Therefore, by forming the core material with a high frequency-adaptive base material, the bottom face of the strip line which has a greater influence on the high frequency characteristics, that is, a surface where irregularities are large and a transmission path becomes long, is disposed at the side of the core material which is the high frequency-adaptive base material. Further, by forming the prepreg disposed on the strip line with a general-purpose base material, a side of a surface of the strip line (a side of the shiny surface of the metallic foil) which has a small influence on the high frequency characteristics becomes a general-purpose base material which is inexpensive compared to the high frequency-adaptive base material. It should be noted that the "surface" described here refers to a surface at a side facing the bottom face disposed at the side of the insulating layer of the core material, and does not include a side face. The general-purpose base material, even if the base material is thin, has more favorable embedding characteristics with respect to the conductor pattern such as the strip line than the high frequency-adaptive base material, which results in excellence in electric corrosion characteristics. Therefore, by forming the core material with a high frequency-adaptive base material and forming the prepreg with a general-purpose base material, it is possible to provide a multilayer wiring board which can maintain high frequency characteristics and electric corrosion characteristics and which can suppress cost. Further, because the prepreg of the general-purpose base material is disposed on the strip line, the high frequency signal line can be provided at the inner layer. Accordingly, it is possible to increase flexibility of a layer structure as the multilayer wiring board.

Further, in the above-described multilayer wiring board, the bottom face of the strip line in the strip structure is located at a side of the high frequency-adaptive base material. The bottom face of the strip line refers to a surface at the side of the insulating layer (core material) of the strip line. Because the metallic foil constituting the core material is laminated so that the matte surface faces the side of the insulating layer, the bottom face, that is, the matte surface of the metallic foil of the strip line formed by patterning the metallic foil or plating, is disposed at the side of the insulating layer of the core material. Therefore, the bottom face of the strip line which has a greater influence on the high frequency characteristics, that is, a surface where irregularities (surface roughness) are large and the transmission path is long, is disposed at the side of the core material which is the high frequency-adaptive base material, so that it is possible to improve the high frequency characteristics.

The strip line preferably has a protruding convex toward a side of the prepreg. By this means, only by using the high frequency-adaptive base material as the core material and patterning the metallic foil or plating laminated on the both sides of the insulating layer using a subtraction method, or the like, the strip line which excels in high frequency characteristics can be easily formed. Further, because the metallic foil of the core material is disposed so that the matte surface faces the side of the insulating layer, the bottom face of the strip line (matte surface of the metallic foil) is inevitably located at the side of the insulating layer (at the side of the high frequency-adaptive base material) of the core material.

The surface roughness of the bottom face of the strip line is preferably greater than the surface roughness of the surface of the strip line. By this means, because an area where the bottom face of the strip line contacts the insulating layer of the core material which is the high frequency-adaptive base material can be made larger than an area where the surface of the strip line contacts the prepreg which is the general-purpose base material, the core material which is the high frequency-adaptive base material has a greater influence on the high frequency characteristics of the strip line, so that it is possible to improve the high frequency characteristics of the multilayer wiring board. It should be noted that the "surface roughness" is roughness represented using ten-point average roughness Rz specified in JIS B 0601-1998. In a case of a copper foil-pasted laminated sheet using the high frequency-adaptive base material as the core material, typically, the matte surface of the copper foil is disposed at the side of the core material. Therefore, when the strip line is formed by performing patterning using the copper foil, the surface roughness of the bottom face of the strip line is typically equal to the surface roughness of the matte surface of the copper foil (from 6.5 to 23 μm in Rz for a standard foil having a thickness of from 12 to 70 μm). Further, while the surface roughness of the surface of the strip line is equal to the surface roughness of the shiny surface of the copper foil (from 1.0 to 2.3 μm in Rz for a standard foil having a thickness of from 12 to 70 μm), typically, in order to increase adhesive strength to the prepreg, copper oxide treatment or surface roughening treatment by etching, or the like, is implemented. Therefore, the surface roughness of the surface and the side face of the strip line is typically from 2 to 4 μm in Rz.

It is desirable that an area where the bottom face of the strip line contacts the insulating layer of the core material is equal to or larger than an area where the surface of the strip line contacts the prepreg. By this means, the core material which is the high frequency-adaptive base material has a greater influence on the high frequency characteristics of the strip line, so that it is possible to improve the high frequency characteristics of the multilayer wiring board.

It is desirable that a ratio of the thickness between the core material and the prepreg is any ratio from 1:4 and 5:1. In the multilayer wiring board, because it is often the case that the thickness of the core material except the metallic foil is from 0.06 to 0.3 mm and the thickness of the strip line formed by patterning the metallic foil or plating is from 3 to 30 µm, if the thickness of the prepreg after being formed by curing through integrally lamination or the like, is from 0.06 to 0.24 mm, the strip line is sufficiently embedded by the prepreg, so that is it possible to secure electric corrosion characteristics.

It is desirable that a ratio between a line width and a thickness of the strip line is any ratio from 1:1 to 15:1. In the multilayer wiring board, because it is often the case that the thickness of the strip line is from 3 to 30 µm when embedding characteristics by the prepreg are taken into account, if the width is from 30 to 500 µm, patterning using a subtraction method or the like becomes easy. By this means, because a cross-sectional shape of the strip line never becomes vertically long compared to a square, the strip line is sufficiently embedded by the prepreg, so that it is possible to secure electric corrosion characteristics.

Next, a manufacturing method of an example of an embodiment of the multilayer wiring board of the present invention will be described.

Figure 2:
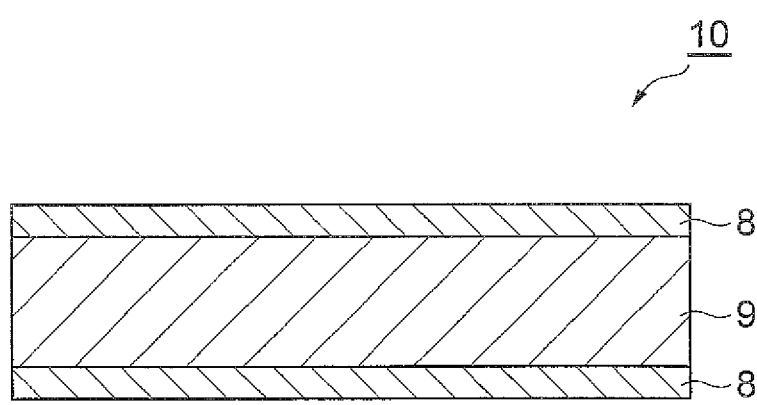
FIG. 2 is a schematic cross-section diagram illustrating a manufacturing method of an example of the embodiment of the multilayer wiring board of the present invention.
Figure 2:
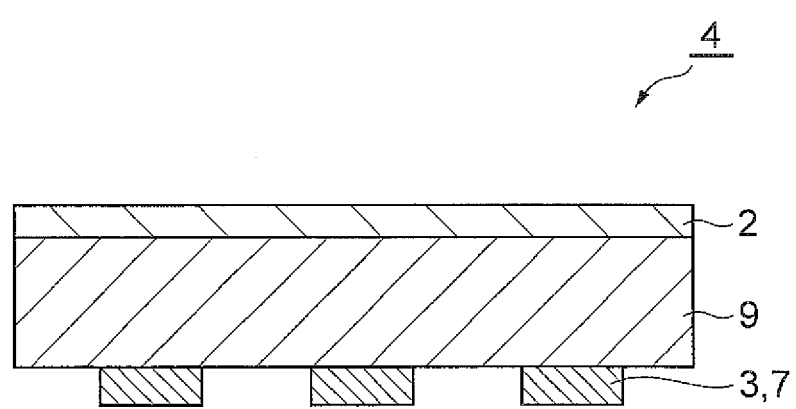

First, as illustrated in FIG. 2(a), a metallic foil-pasted laminated sheet 10 in which metallic foils 8 are laminated at the both sides of the high frequency-adaptive base material which is the insulating layer 9, is prepared. Subsequently, as illustrated in FIG. 2(b), the metallic foils 8 of the metallic foil-pasted laminated sheet 10 are patterned, and the core material 4 is made by forming the ground pattern 2 on one side of the insulating layer 9 and forming the strip line 3 or the low frequency signal line 7 on the other side. It is also possible to form interlayer connection through a through-hole (not illustrated) as appropriate at the core material 4. In this case, because plating is formed inside of the through-hole and on the metallic foil 8 of the surface, patterning is performed on the plating and the metallic foil 8.

Figure 3:
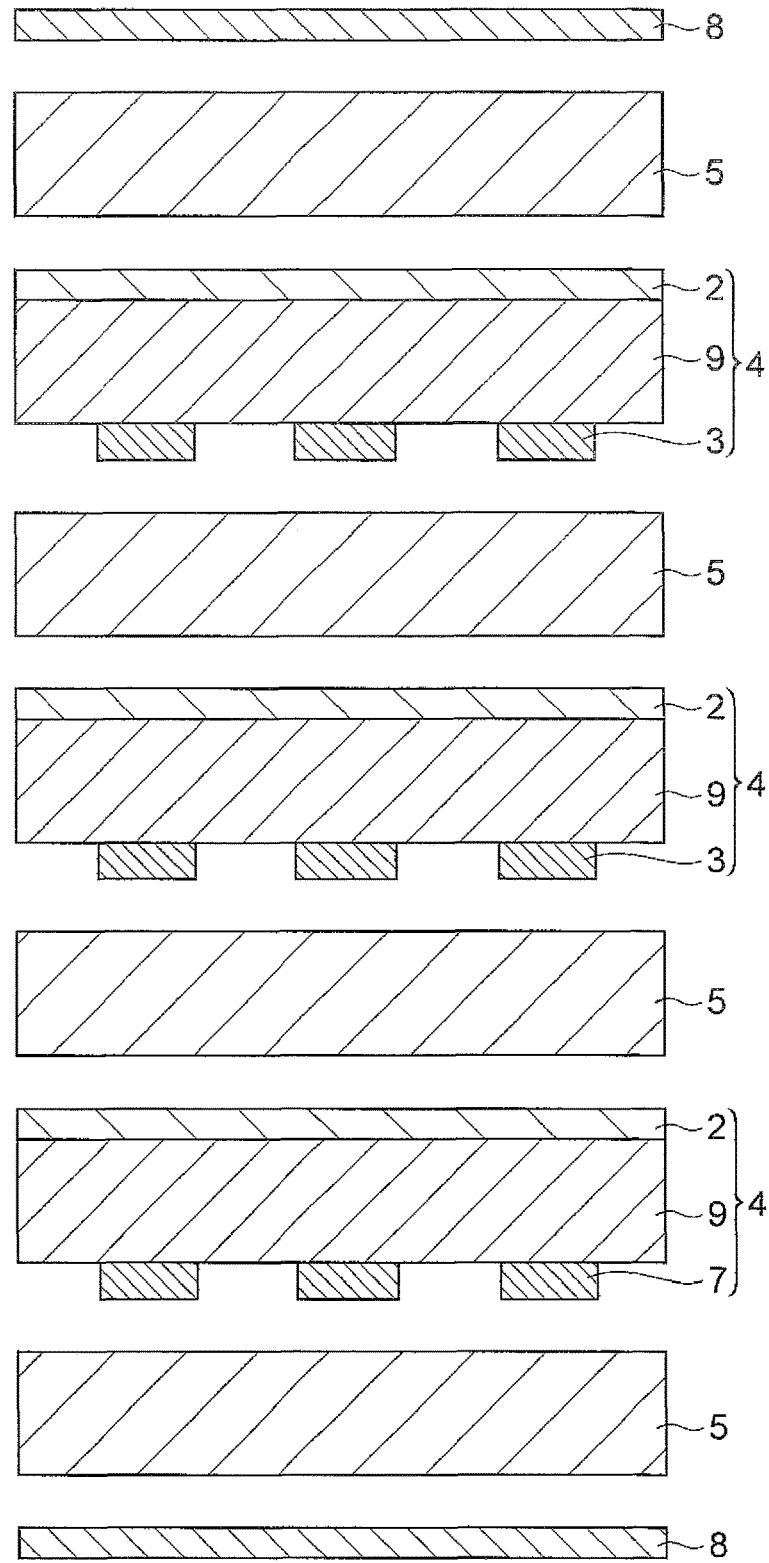
FIG. 3 is a schematic cross-section diagram illustrating a manufacturing method of an example of the embodiment of the multilayer wiring board of the present invention.

Next, as illustrated in FIG. 3, the core material 4 and the prepreg 5 formed with the general-purpose base material are alternately disposed so that the insulating layers 9 put the core material 4 formed with the high frequency-adaptive base material therebetween from the both sides, and a copper foil 8 is disposed on an outer side of the prepreg 5. At this time, another core material 4 or the multilayer wiring board 1 may be disposed in place of the copper foil 8. After each member is disposed in this manner, the members are integrally molded by a heat and pressure press, or the like, to obtain a laminate 11 illustrated in FIG. 4. If needed, interlayer connection through a through-hole by a penetrating hole or a via hole by a non-penetrating hole may be formed. In this case, plating (not illustrated) is formed inside the through-hole or the via hole and on the metallic foil 8 of the surface. Further, if needed, patterning is performed on the metallic foil 8 or the plating using a subtraction method or the like. Further, if needed, solder resist, symbol mark or protective plating (such as nickel-gold plating) is formed. The multilayer wiring board 1 illustrated in FIG. 1 is made in this manner.

Figure 5:
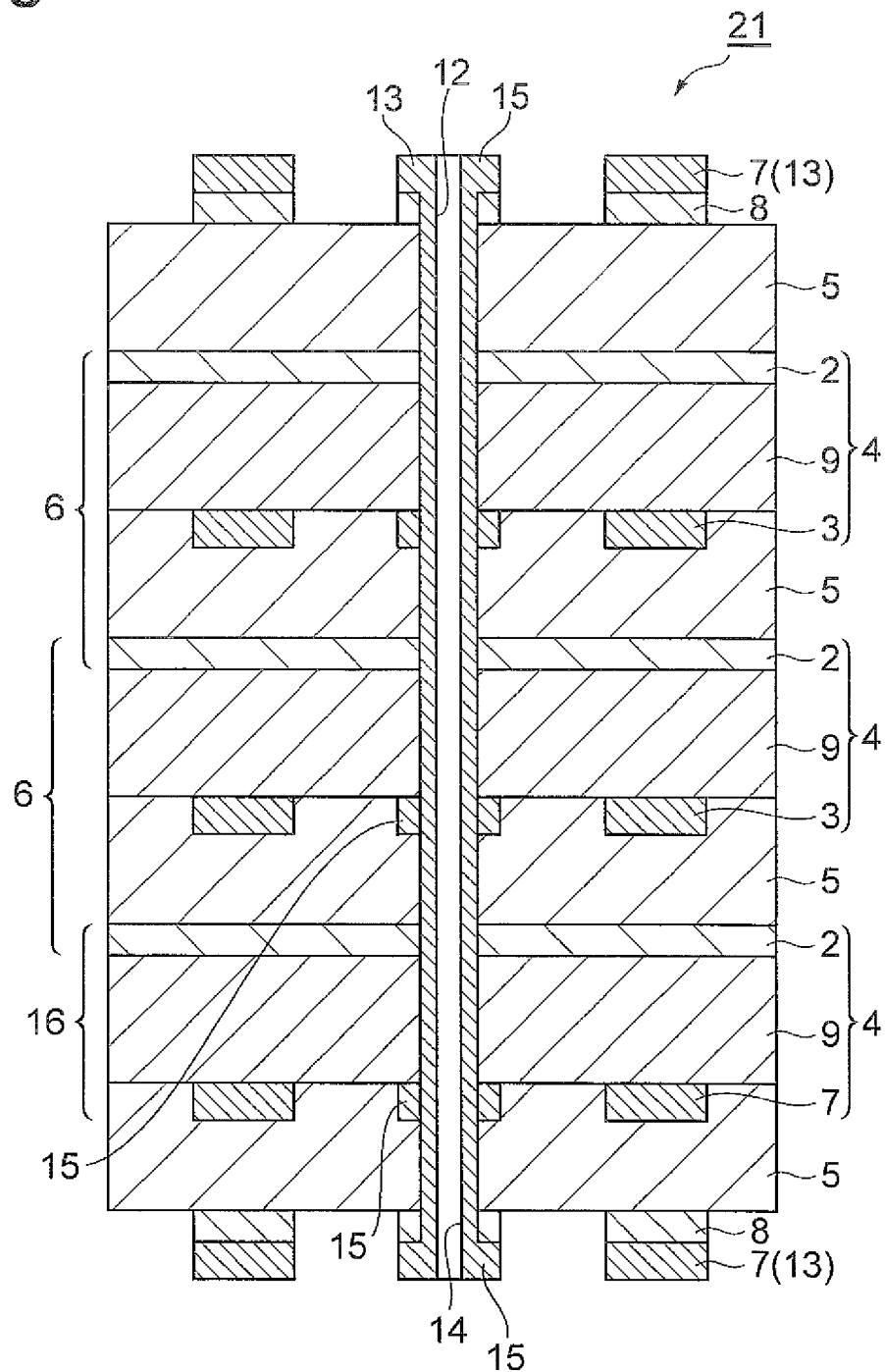
FIG. 5 is a schematic diagram of a cross section illustrating another example of the embodiment of the multilayer wiring board of the present invention.

Here, another example of the embodiment of the multilayer wiring board of the present invention is illustrated in FIG. 5. A multilayer wiring board 21 according to another example of the present embodiment has a strip structure 6 comprising a core material 4 having an insulating layer 9, a ground pattern 2 disposed on one side of the insulating layer 9 and a strip line 3 disposed on the other side of the insulating layer 9, a prepreg 5 disposed on the strip line 3 of the core material 4, and another ground pattern 2 disposed on the prepreg 5. In this multilayer wiring board 21, the insulating layer 9 of the core material 4 is formed with a high frequency-adaptive base material and the prepreg 5 is formed with a general-purpose base material. Further, by forming through-hole plating 13 inside a penetrating hole 12 which penetrates through the multilayer wiring board 21, a through-hole 14 is formed. In the outermost layer, a through-hole land 15 connecting to the through-hole 14 is disposed, and a low frequency signal line 7 or a footprint 7 is disposed so as to connect to the through-hole land 15. In the inner layer, the strip line 3 or a high frequency signal line 3, or the low frequency signal line 7 is disposed, and is electrically connected to the through-hole 14 by connection between the through-hole land 15 and the through-hole plating 13. It should be noted that while, in the present embodiment, the low frequency signal line 7 is disposed as a conductor pattern of a micro-strip structure 16, the strip line 3 or the high frequency signal line 3 may be disposed in place of the low frequency signal line 7.

In this way, by disposing the low frequency signal line 7 in the outermost layer and disposing the strip line 3 or the high frequency signal line 3 or the low frequency signal line 7 in the inner layer, impedance can be easily controlled in the multilayer wiring board 21, so that it is possible to maintain the high frequency characteristics more easily. That is, if the through-hole 14 which penetrates through the multilayer wiring board 21 is formed, because the through-hole plating 13 is formed on the copper foil 8 in the outermost layer, not only is a thickness of a conductor when patterning is performed through etching, or the like, greater than a case of only the copper foil 8, but the variation is also greater. Therefore, accuracy of a line width which has a great influence on impedance control tends to degrade. Meanwhile, in the inner layer, because it is only necessary to perform patterning on only the copper foil, the thickness of the conductor is thinner than that in the outermost layer, and accuracy of the thickness is favorable. Therefore, in the multilayer wiring board 21, it is possible to improve accuracy of the line width which is important for impedance control. Accordingly, maintenance of the high frequency characteristics becomes easier.

EXAMPLE

While the present invention will be described below in more details with an example, the present invention is not limited to the following example.

First, as illustrated in FIG. 2(a), as a both side copper foil-pasted laminated sheet 10 using a high frequency-adaptive base material, MCL-FX-2 (manufactured by Hitachi Chemical Company, Ltd., trade name, having a sheet thickness of 0.1 mm, "MCL" is a trademark) was prepared. This both side copper foil-pasted laminated sheet 10 uses a general copper foil (having surface roughness of a matte surface of from 7 to 11 µm in Rz, and the shiny surface of from 1.0 to 2.3 µm in Rz) having a thickness of 18 µm as a copper foil, and lamination is performed so that the matte surface of the copper foil faces the side of an insulating layer. Next, as illustrated in FIG. 2(b), the copper foil (having a thickness of 18 µm) of this both side copper foil-pasted laminated sheet 10 was patterned using a subtraction method, and a core material 4 was made by forming a ground pattern 2 on one surface and forming a high frequency signal line (having a line width of 100 µm and a line length of 125 mm) which becomes a strip line 3 and a comb-shaped pattern for evaluating electric corrosion characteristics (having a line width of 90 µm and line spacing of 90 µm, not illustrated) on the other surface.

Next, roughening treatment for increasing adhesive strength to a prepreg was performed on a surface (a shiny surface of the copper foil) of each pattern of the ground pattern 2 of the core material 4, the strip line 3 and the comb-shaped pattern for evaluating electric corrosion characteristics. The roughening treatment was performed using MB100 (manufactured by MacDermid Co., Ltd., trade name) under the condition that an etching amount was 2 µm. The surface roughness of the patterns including the strip line 3 at this time was from 2 to 4 µm in Rz.

Next, as illustrated in FIG. 3, four sheets of GEA-679 (manufactured by Hitachi Chemical Company, Ltd., trade name, having a thickness of 0.06 mm) were prepared as the prepreg 5 of the general-purpose base material. One sheet of the core material 4 and one sheet of the prepreg 5 were alternately disposed so as to put the both sides of each of three sheets of the core material 4 therebetween, and the copper foil 8 (having a thickness of 18 µm) for conductor patterning which would become the outermost layer of the multilayer wiring board was disposed. Subsequently, the members were integrally molded by a heat and pressure press under the conditions of 190° C. for two hours, to thereby obtain a laminate 11 illustrated in FIG. 4.

Figure 4:
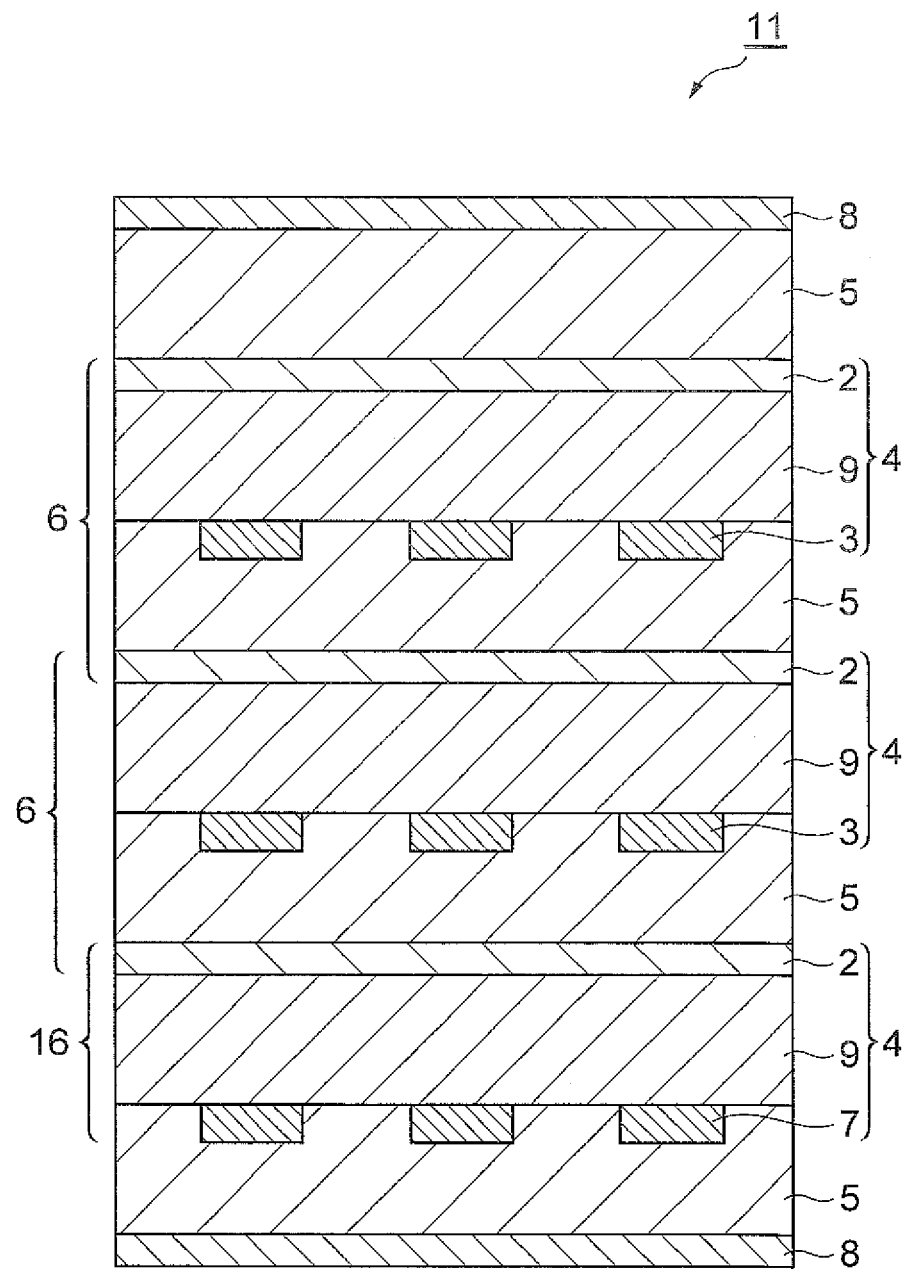
FIG. 4 is a schematic cross-section diagram illustrating a manufacturing method of an example of the embodiment of the multilayer wiring board of the present invention.

Next, as illustrated in FIG. 5, a penetrating hole 12 for a through-hole was provided at the laminate 11 in FIG. 4 so as to be electrically connected to the strip line 3 of the core material 4 and the comb-shaped pattern (not illustrated) disposed in the inner layer, and then through-hole plating 13 (electrolytic copper plating of a thickness of 30 µm) was performed on the penetrating hole 12 and the copper foil 8 to form the through-hole 14. Subsequently, a conductor including the copper foil 8 and the copper plating was patterned using a subtraction method, and, as illustrated in FIG. 5, a multilayer wiring board 21 in which the footprint 7 and the through-hole land 15 for measuring high frequency characteristics and electric corrosion characteristics were formed in the outermost layer, was obtained.

Comparative Example 1

Figure 6:
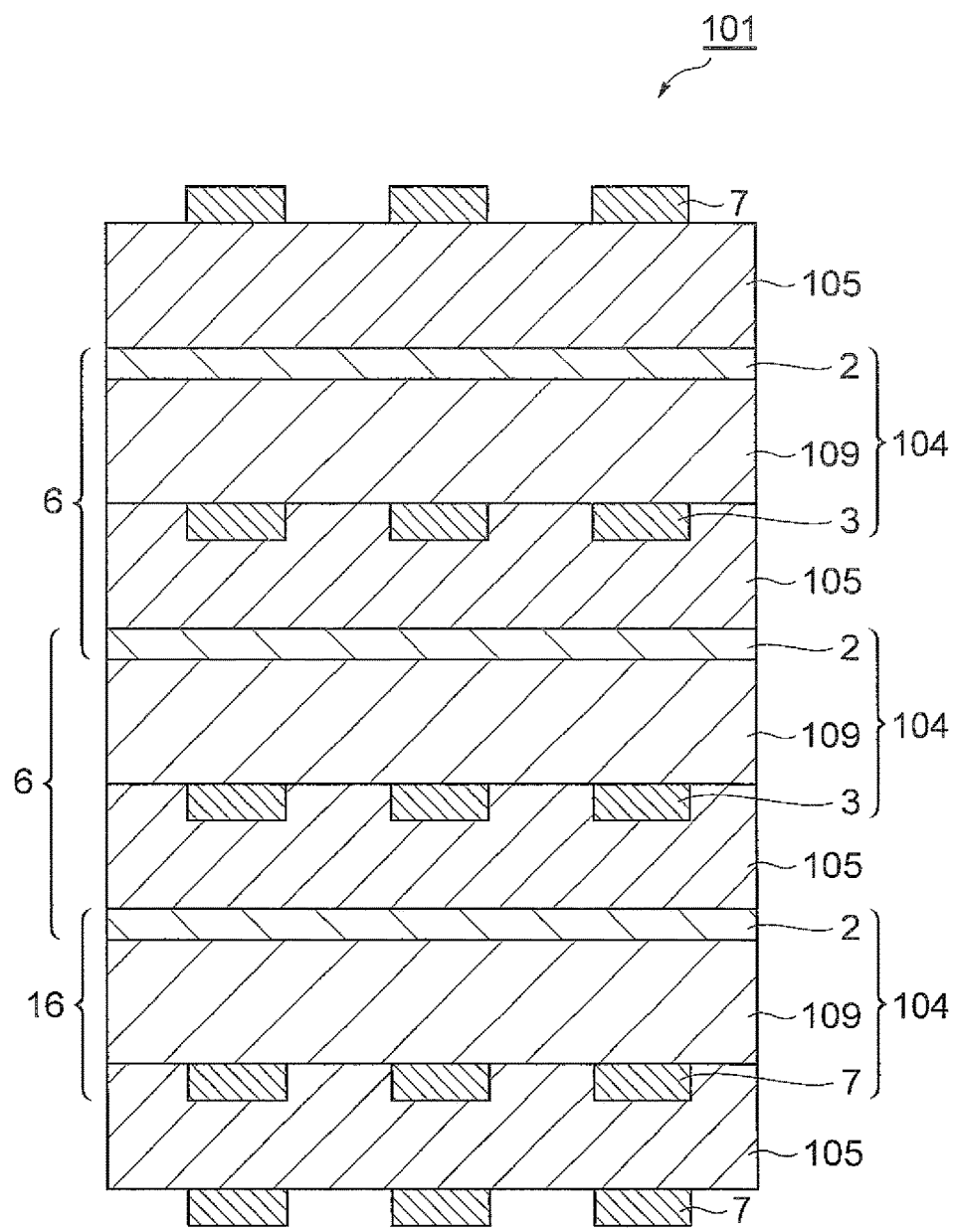
FIG. 6 is a schematic diagram of a cross section illustrating a multilayer wiring board of Comparative Example 1.

Subsequently, as illustrated in FIG. 6, MCL-E679 (manufactured by Hitachi Chemical Company, Ltd., trade name, having a sheet thickness of 0.1 mm, "MCL" is a trademark) was prepared as a both side copper foil-pasted laminated sheet 109 which uses a general-purpose base material to make a core material 104 in a similar manner to Example. Next, GFA-2 (manufactured by Hitachi Chemical Company, Ltd., trade name, having a thickness of 0.06 mm) was prepared as a prepreg 105 of a high frequency-adaptive base material, and one sheet of the core material and one sheet of the prepreg were alternately disposed so as to put the both sides of each of three sheets of the core material therebetween, a copper foil (having a thickness of 18 µm) for conductor patterning which would become an outermost layer of the multilayer wiring board was disposed, and the members were integrally molded by a heat and pressure press in a similar manner to Example to thereby obtain a laminate. Then, a multilayer wiring board 101 in FIG. 6 was obtained in a similar manner to Example.

Comparative Example 2

Figure 7:
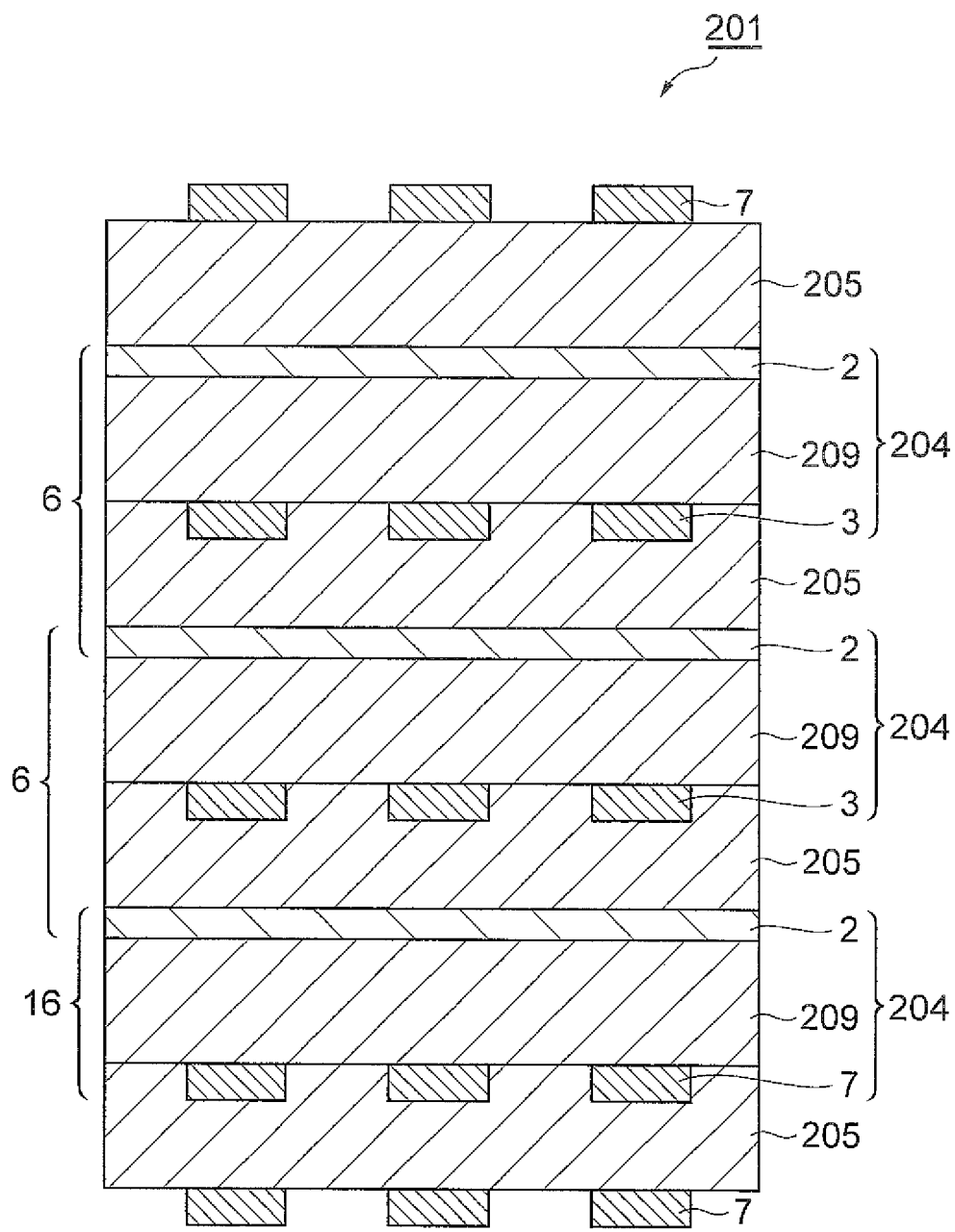
FIG. 7 is a schematic diagram of a cross section illustrating a multilayer wiring board of Comparative Example 2.

Further, as illustrated in FIG. 7, MCL-FX-2 (manufactured by Hitachi Chemical Company, Ltd., trade name, having a sheet thickness of 0.1 mm, "MCL" is a trademark) was prepared as a both side copper foil-pasted laminated sheet 209 which uses a high frequency-adaptive base material, and a core material 204 was prepared in a similar manner to Example. Next, GFA-2 (manufactured by Hitachi Chemical Company, Ltd., trade name, having a thickness of 0.06 mm) was prepared as a prepreg 205 of a high frequency-adaptive base material, and one sheet of the core material and one sheet of the prepreg were alternately disposed so as to put the both sides of each of three sheets of the core material therebetween, and further, a copper foil (having a thickness of 18 µm) for conductor patterning which would become the outermost layer of a multilayer wiring board was disposed, and the members were integrally molded by a heat and pressure press in a similar manner to Example to thereby obtain a laminate. Then, a multilayer wiring board 201 of FIG. 7 was obtained in a similar manner to Example.

For the strip lines of the multilayer wiring boards in Example and Comparative Examples 1 and 2, Network Analyzer (manufactured by Agilent Technologies, Inc., trade name) was used to obtain a transmission loss of the strip line of each core material.

Further, a DC voltage of 100 V was applied to the comb-shaped patterns (electric corrosion evaluation patterns) of the multilayer wiring boards in Example and Comparative Examples 1 and 2 in a thermohygrostat bath of a temperature of 85° C. and relative humidity of 85%, and insulation resistance after 500 hours had elapsed was measured to thereby evaluate electric corrosion characteristics.

Table 1 indicates results of the transmission loss measured at a frequency of from 1 to 3 GHz for the strip lines of the multilayer wiring boards in Example and Comparative Examples 1 and 2. Compared to the strip line in Comparative Example 1, the strip line in Example has a lower transmission loss and exhibits favorable high frequency characteristics. Further, the transmission loss of the strip line in Example is slightly inferior to the transmission loss of the strip line in Comparative Example 2, while a cost for manufacturing the multilayer wiring board of Example is substantially reduced compared to Comparative Example 2, which indicates that excellent cost-effectiveness is provided.

TABLE 1

| ITEM | TRANSMISSION LOSS (dB) | | | MANUFACTURING COST INDEX |
| --- | --- | --- | --- | --- |
| | 1 (GHz) | 2 (GHz) | 3 (GHz) | |
| EXAMPLE | −1.342 | −2.647 | −6.052 | 100 |
| COMPARATIVE EXAMPLE 1 | −1.757 | −3.770 | −8.497 | 100 |

TABLE 1-continued

| ITEM | TRANSMISSION LOSS (dB) | | | MANUFACTURING COST INDEX |
|---|---|---|---|---|
| | 1 (GHz) | 2 (GHz) | 3 (GHz) | |
| COMPARATIVE EXAMPLE 2 | −1.072 | −2.189 | −5.627 | 113 |

Table 2 indicates results of the insulation resistance measured 500 hours later by applying a DC voltage of 100 V to the electric corrosion characteristics evaluation patterns of the multilayer wiring boards in Example and Comparative Examples 1 and 2 in the thermohygrostat bath of a temperature of 85° C. and relative humidity of 85%. It should be noted that the insulation resistance was measured using Ultra Megohmmeter SM-8220 (manufactured by DKK-TOA CORPORATION, trade name) with an applied voltage of 100 V and with an application period of 60 seconds. Further, the number of samples N of the measured electric corrosion characteristics evaluation patterns is 5 in all Example and Comparative Examples 1 and 2, and a maximum, a minimum and an average are indicated. As a result, a change rate (decreasing rate) of the insulation resistance after 500 hours had elapsed after the treatment in Example is significantly smaller than those of Comparative Examples 1 and 2, which demonstrates a tendency of small degradation.

TABLE 2

| ITEM | | INITIAL RESISTANCE ($\Omega$) | RESISTANCE AFTER 500 HOURS ELAPSED ($\Omega$) | CHANGE RATE OF INSULATION RESISTANCE (%) |
|---|---|---|---|---|
| EXAMPLE | AVERAGE | $5.54 \times 10^{12}$ | $4.23 \times 10^{12}$ | −23.6% |
| | MAXIMUM | $6.03 \times 10^{12}$ | $5.09 \times 10^{12}$ | −15.6% |
| | MINIMUM | $5.31 \times 10^{12}$ | $3.76 \times 10^{12}$ | −29.2% |
| COMPARATIVE EXAMPLE 1 | AVERAGE | $5.64 \times 10^{12}$ | $9.77 \times 10^{11}$ | −82.7% |
| | MAXIMUM | $5.98 \times 10^{12}$ | $1.35 \times 10^{12}$ | −77.4% |
| | MINIMUM | $5.48 \times 10^{12}$ | $9.22 \times 10^{11}$ | −83.2% |
| COMPARATIVE EXAMPLE 2 | AVERAGE | $6.00 \times 10^{12}$ | $9.89 \times 10^{11}$ | −83.5% |
| | MAXIMUM | $7.13 \times 10^{12}$ | $1.28 \times 10^{12}$ | −82.0% |
| | MINIMUM | $5.96 \times 10^{12}$ | $9.11 \times 10^{11}$ | −84.7% |

INDUSTRIAL APPLICABILITY

The present invention can be applied to a multilayer wiring board, particularly, a multilayer wiring board used for high frequency applications.

REFERENCE SIGNS LIST 1, 21 . . . Multilayer wiring board, 2 . . . Ground pattern, 3 . . . Strip line or high frequency signal line, 4 . . . Core material, 5 . . . Prepreg, 6 . . . Strip structure, 9 . . . Insulating layer, 14 . . . Through-hole, 16 . . . Micro-strip structure.

The invention claimed is:

1. A multilayer wiring board comprising:
   a core material having an insulating layer, a first ground pattern disposed on one side of the insulating layer, and a strip line disposed on the other side of the insulating layer;
   a prepreg disposed on the strip line of the core material, the prepreg comprising a reinforcement material and an insulating resin impregnated in the reinforcement material; and
   a second ground pattern disposed on the prepreg,
   wherein the insulating layer of the core material comprises a high frequency-adaptive base material, and the prepreg comprises a general-purpose base material, and
   wherein a relative permittivity after curing and a dielectric loss tangent of the general-purpose base material of the prepreg are respectively higher than a relative permittivity after curing and a dielectric loss tangent of the high frequency-adaptive base material.

2. The multilayer wiring board according to claim 1, wherein the high frequency-adaptive base material is a base material having relative permittivity of less than 4.00 and a dielectric loss tangent of less than 0.0100.

3. The multilayer wiring board according to claim 1, wherein the general-purpose base material is a base material having relative permittivity after curing of 4.20 or greater and a dielectric loss tangent of 0.0130 or greater.

4. The multilayer wiring board according to claim 1, further comprising a through-hole that penetrates through the core material, the prepreg and the second ground pattern.

5. The multilayer wiring board according to claim 1, wherein the prepreg includes a fiber-like reinforcement material.

6. The multilayer wiring board according to claim 1, wherein the prepreg includes a reinforcement material comprising at least one of paper, glass fiber and aramid fiber.

7. The multilayer wiring board according to claim 1, wherein the prepreg includes a reinforcement material comprising at least one of paper, a woven fabric and a non-woven fabric.

8. The multilayer wiring board according to claim 1, wherein a bottom face of the strip line is disposed at a side of the insulating layer configured to include the high frequency-adaptive base material.

9. The multilayer wiring board according to claim 1, wherein the strip line has a protruding shape toward a side of the prepreg.

10. The multilayer wiring board according to claim 1, wherein surface roughness of a bottom face of the strip line is greater than surface roughness of a surface of the strip line.

11. The multilayer wiring board according to claim 1, wherein an area where a bottom face of the strip line contacts the insulating layer is equal to or larger than an area where a surface of the strip line contacts the prepreg.

12. The multilayer wiring board according to claim 1, wherein a ratio of a thickness between the core material and the prepreg is any ratio from 1:4 to 5:1.

13. The multilayer wiring board according to claim 1, wherein a ratio between a line width and a thickness of the strip line is any ratio from 1:1 to 15:1.

* * * * *